US011128056B2

(12) United States Patent
Rogers

(10) Patent No.: US 11,128,056 B2
(45) Date of Patent: Sep. 21, 2021

(54) WAVEGUIDE-FED PLANAR ANTENNA ARRAY

(71) Applicant: The Boeing Company, Chicago, IL (US)

(72) Inventor: John E. Rogers, Owens Cross Roads, AL (US)

(73) Assignee: THE BOEING COMPANY, Chicago, IL (US)

(*) Notice: Subject to any disclaimer, the term of this patent is extended or adjusted under 35 U.S.C. 154(b) by 230 days.

(21) Appl. No.: 15/948,836

(22) Filed: Apr. 9, 2018

(65) Prior Publication Data
US 2019/0312358 A1  Oct. 10, 2019

(51) Int. Cl.
| H01Q 13/10 | (2006.01) |
| H01Q 21/06 | (2006.01) |
| H05K 3/46 | (2006.01) |
| H05K 1/02 | (2006.01) |
| H01P 3/08 | (2006.01) |
| H01Q 21/00 | (2006.01) |

(52) U.S. Cl.
CPC .......... *H01Q 21/064* (2013.01); *H01P 3/081* (2013.01); *H01Q 13/10* (2013.01); *H01Q 21/0075* (2013.01); *H01Q 21/0087* (2013.01); *H05K 1/025* (2013.01); *H05K 3/4673* (2013.01); *H05K 2201/093* (2013.01)

(58) Field of Classification Search
CPC ............ H01Q 21/064; H01Q 21/0075; H01Q 21/0087; H01Q 13/10; H05K 3/4673; H05K 1/025; H05K 2201/093; H01P 3/081; H01P 5/107
See application file for complete search history.

(56) References Cited

U.S. PATENT DOCUMENTS

| 4,843,400 A * | 6/1989 | Tsao ..................... H01Q 9/0428 343/700 MS |
| 2001/0050651 A1* | 12/2001 | Grangeat ............. H01Q 13/106 343/767 |
| 2011/0025429 A1* | 2/2011 | Syal ........................ H01P 3/081 333/34 |

(Continued)

OTHER PUBLICATIONS

Zhang, G-H., et al., "A Circular Waveguide Antenna Using High-Impedance Ground Plane", IEEE Antennas and Wireless Propagation Letters, 2003, pp. 86-88, vol. 2.

(Continued)

*Primary Examiner* — Awat M Salih
(74) *Attorney, Agent, or Firm* — Gates & Cooper LLP

(57) ABSTRACT

A novel planar antenna array fed by an integrated waveguide and a method for producing same is presented. The antenna array is an aperture coupled array fed by an embedded microstrip line. The embedded microstrip line transitions to a stripline feed then back to a microstrip line such that the lower ground plane of the antenna array becomes the upper ground plane with the waveguide placed on the backside of the array. The microstrip feed then couples to the waveguide for signal transmission and reception. With the exception of the waveguide itself, the elements can be simultaneously fabricated on the same RF board, using subtractive (e.g., milling, etching) and additive (e.g., deposition, 3D printing) methods.

20 Claims, 9 Drawing Sheets

(56) References Cited

U.S. PATENT DOCUMENTS

2018/0205134 A1* 7/2018 Khan .................... H01Q 5/314
2019/0207286 A1* 7/2019 Moallem ................ H01Q 13/02

OTHER PUBLICATIONS

Rida, A., et al., "Proximity Coupled Fed Antenna Arrays on LCP for mm-Wave Applications", Antennas and Propagation Society International Symposium (APSURSI), 2010 IEEE, pp. 1-4, Toronto, ON, Canada.

Li, B., et al., "Study on High Gain Circular Waveguide Array Antenna With Metamaterial, Structure", Progress in Electromagnetics Research, 2006, pp. 207-219, Pier 60.

Cheng, Y-J., et al., "W-Band Large-Scale High-Gain Planar Integrated Antenna Array", IEEE Transactions on Antennas and Propagation, Jun. 2014, pp. 3370-3373, vol. 62, No. 6.

* cited by examiner

WAVEGUIDE-FED PLANAR ANTENNA ARRAY

BACKGROUND

1. Field

The present disclosure relates to systems for receiving and transmitting signals, and in particular to a system and method for waveguide-fed planar antenna array and a method for producing same.

2. Description of the Related Art

Conformal sensors substantially conform to the contours of the surface that they are mounted on or of which surface they form a part. Low profile conformal sensor nodes are useful in many applications, including structural health monitoring and diagnostic testing. With regard to structural health monitoring, conformal antennas in sensor nodes can gather information about an aircraft in real time, including airframe characteristics including hoop stress, shear stress, compression, corrosion resistance, bending, torsion, crack growth, high local loads, longitudinal stress and impacts. With regard to diagnostic testing, conformal antennas in sensor nodes can be used for condition monitoring on the factory floor.

The size, weight, and power (SWaP) constraints required for such sensors makes a planar antenna with a waveguide feed very appealing. Furthermore, the ability to feed a planar antenna directly from the backside eliminates the need for edge-fed connectors, which increase the overall height of the antenna and complicate the ability to have an antenna flush with the surface.

Planar antennas may be fed by a microstrip or stripline feed which is connected to a coaxial adapter that enables signal transmission and reception. For really high frequencies, such as millimeter-wave frequencies, waveguides are preferred over coax for signal transmission and reception due to their inherent low-loss characteristics. Hence, to adapt a waveguide to a planar antenna array typically requires both a coaxial adapter and a coax-to-waveguide adapter.

Existing coaxial and coax-to-waveguide adapters, however, can be cost prohibitive at millimeter wave frequencies. Further, they may increase the overall size and weight of the antenna. What is needed is a planar antenna array fed by an integrated waveguide.

SUMMARY

To address the requirements described above, this document discloses a planar antenna and a method for producing same. One embodiment is evidenced by a planar antenna, comprising a circuit board and a waveguide. The circuit board comprises a composite dielectric and a conductor. The composite dielectric comprises a top planar surface and a bottom planar surface. The top planar surface comprises a first top planar surface portion having a top surface conductive ground plane and a second top surface planar portion having at least one planar antenna element. The bottom planar surface has a first bottom surface planar portion having a bottom surface conductive ground planar electrically shorted to the top surface conductive ground plane. The conductor extends through the composite dielectric between the top planar surface and the bottom planar surface, and forms a transmission line extending from the planar antenna element to the waveguide antenna element. The waveguide is affixed to the second bottom surface planar portion, and comprises a conductive cavity disposed about the waveguide antenna element.

In one embodiment, the planar antenna element comprises an antenna conductive surface having an aperture; and the conductive surface is aperture coupled to the transmission line.

In another embodiment, the antenna conductive surface comprises a slot; and at least a portion of the transmission line is disposed within the composite dielectric between the slot and the bottom surface conductive ground plane.

In another embodiment, the top surface conductive ground plane overlaps the bottom surface conductive ground plane in a direction perpendicular to the bottom planar surface and the top planar surface at an overlapping portion of the circuit board, and bottom surface conductive ground plane is electrically shorted to the top surface conductive ground plane by at least one via extending through the circuit board at the overlapping portion.

In still another embodiment, the conductor comprises a stripline transmission line portion formed with the top surface conductive ground plane and the bottom surface conductive ground plane in the overlapping portion of the top surface conductive ground plane and the bottom surface conductive ground plane; and a first microstrip transmission line portion formed with the top surface conductive ground plane a second microstrip transmission line portion formed with the bottom surface conductive ground plane elsewhere on the circuit board.

Another embodiment is evidenced by a method of forming a planar array antenna. The method comprises disposing a top surface conductive ground plane on a first top surface planar portion of a first dielectric and a planar antenna element on a second top surface planar portion of the first dielectric; disposing a conductor on a top surface of a second dielectric; disposing a bottom surface conductive ground plane on a first bottom surface planar portion of a third dielectric, and a waveguide antenna element on a second bottom surface planar portion of the third dielectric; laminating a bottom surface planar portion of the first dielectric to the top surface of the second dielectric and a top surface planar portion of the third dielectric to a bottom surface of second dielectric so that the conductor forms a transmission line extending from the planar antenna element to the waveguide antenna element; and electrically shorting the top surface conductive ground plane to the bottom surface conductive ground plane.

In one embodiment, the method further comprising: affixing a waveguide to the second bottom surface planar portion, the waveguide comprising a conductive cavity disposed about the waveguide antenna element.

In a still further embodiment, the planar antenna element comprises a conductive surface having an aperture and the lamination disposes the conductive surface proximate and capacitively coupled to the transmission line.

A still further embodiment is evidenced by an array antenna, formed by performing steps comprising the steps of disposing a top surface conductive ground plane on a first top surface planar portion of a first dielectric and a planar antenna element on a second top surface planar portion of a first dielectric; disposing a conductor on a top surface of a second dielectric; disposing a bottom surface conductive ground plane on a first bottom surface planar portion of a third dielectric, and a waveguide antenna element on a second bottom surface planar portion of the third dielectric; laminating a bottom surface planar portion of the first dielectric to the top surface of the second dielectric and a top surface planar portion of the third dielectric to a bottom surface of second dielectric so that the conductor forms a transmission line extending from the planar antenna element to a waveguide antenna element; and electrically shorting the top surface conductive ground plane to the bottom surface conductive ground plane.

The features, functions, and advantages that have been discussed can be achieved independently in various embodiments of the present invention or may be combined in yet other embodiments, further details of which can be seen with reference to the following description and drawings.

BRIEF DESCRIPTION OF THE DRAWINGS

Referring now to the drawings in which like reference numbers represent corresponding parts throughout.

DESCRIPTION

In the following description, reference is made to the accompanying drawings which form a part hereof, and which is shown, by way of illustration, several embodiments. It is understood that other embodiments may be utilized and structural changes may be made without departing from the scope of the present disclosure.

Overview

A novel planar antenna array fed by an integrated waveguide is presented. The antenna array is an aperture coupled array fed by an embedded microstrip line. The embedded microstrip line transitions to a stripline feed then back to a microstrip line such that the lower ground plane of the antenna array becomes the upper ground plane with the waveguide placed on the backside of the array. The microstrip feed then couples to the waveguide for signal transmission and reception. With the exception of the waveguide itself, the elements can be simultaneously fabricated on the same RF board, using subtractive (e.g., milling, etching) and additive (e.g., deposition, 3D printing) methods. The disclosed waveguide fed antenna array is unique from other planar arrays in that it (1) utilizes an integrated waveguide to reduce size, weight, and cost, (2) can be fabricated on the same RF board with the exception of the waveguide, (3) can be adapted to utilize both circular and rectangular waveguide types, and (4) can be manufacturing using additive 3D printing techniques.

Figure 1A:
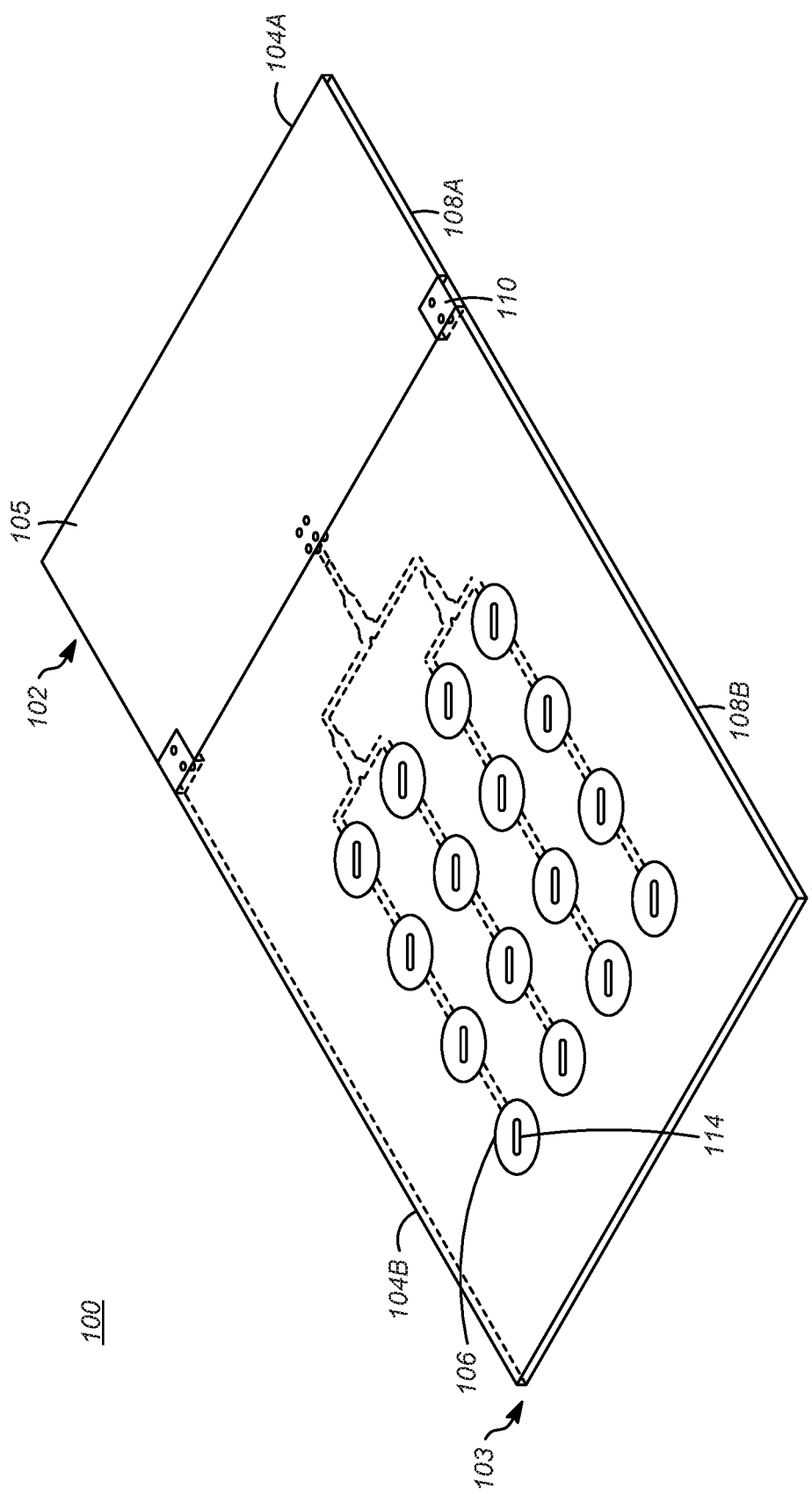
FIGS. 1A and 1B are diagrams illustrating one embodiment of the planar antenna.
Figure 1B:
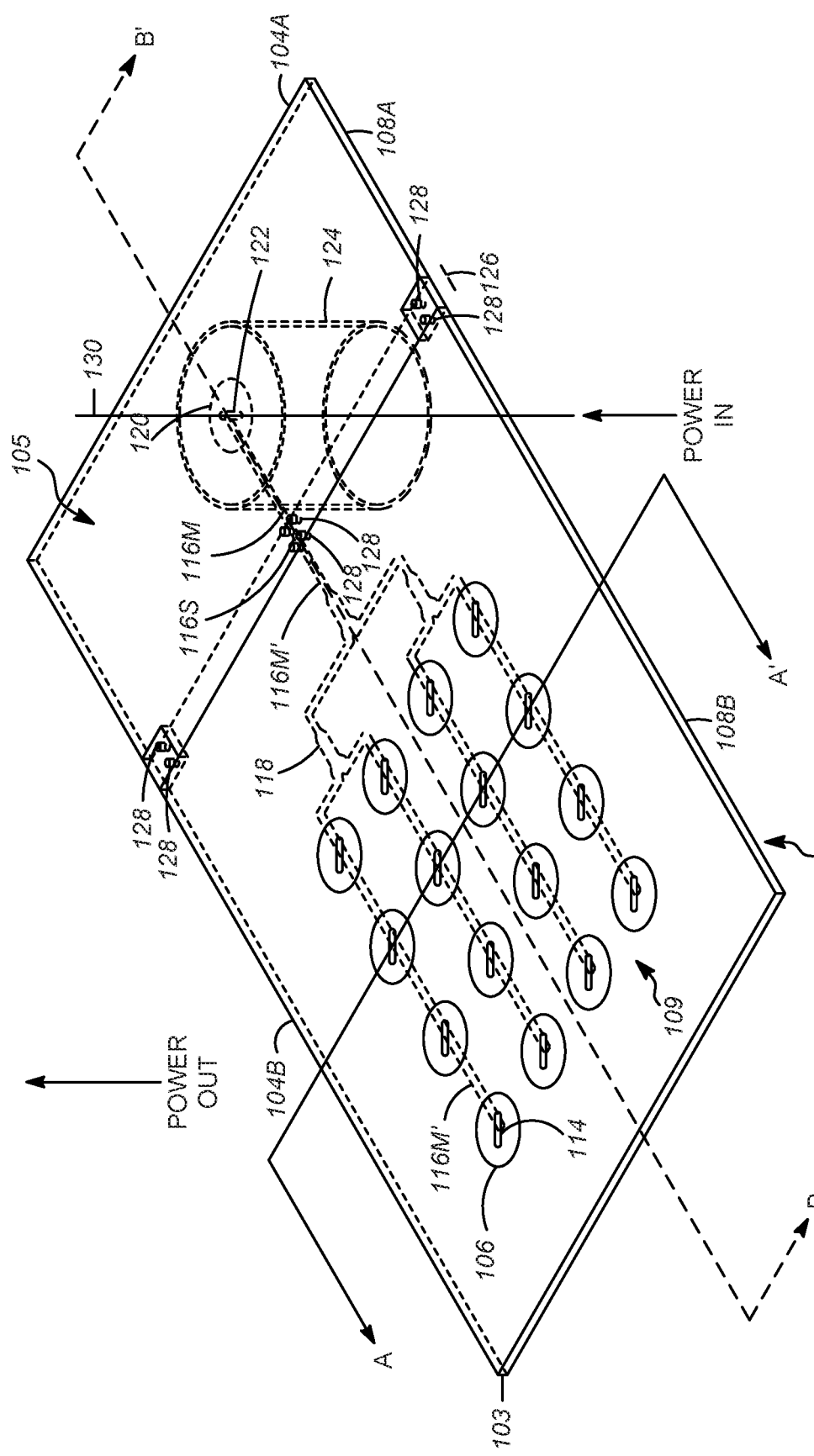
Figure 2A:
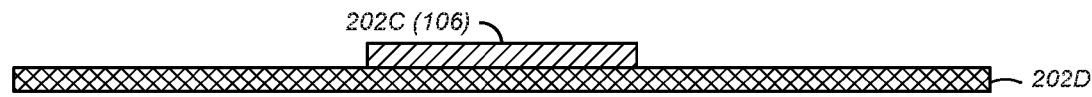
FIGS. 2A-2E are diagrams showing one embodiment of the different layers of the composite dielectric 103 through slice A-A' of FIG. 1B and how they may be assembled into the RF circuit board.
Figure 2B:
Figure 2C:
Figure 2D:
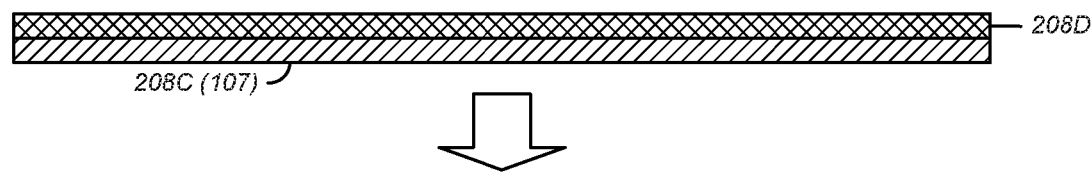
Figure 2E:
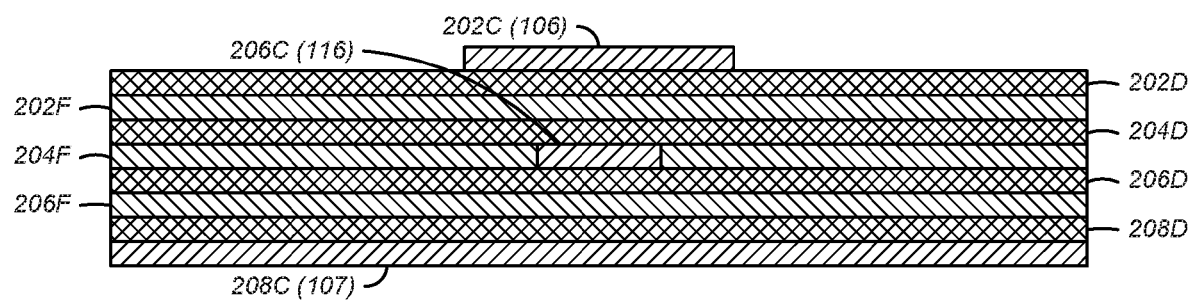

FIGS. 1A and 1B are diagrams illustrating one embodiment of the planar antenna 100. In the illustrated embodiment, the planar antenna 100 includes an RF circuit board 102 having a composite dielectric 103. The composite dielectric comprises a top planar surface 104 that has a first top surface planar portion 104A and a second top surface planar portion 104B. The first top surface planar portion 104A comprises a top surface conductive ground plane 105, and the second top surface planar portion 104B has at least one planar antenna element 106. In the illustrated embodiment, a 4×4 array of planar antenna elements is included.

The composite dielectric 103 also comprises a bottom planar surface 108 which has a first bottom surface planar portion 108B and a second bottom surface planar portion 108A. The first bottom surface planar portion 108B has a bottom surface conductive ground plane 107 that is electrically shorted to the top surface conductive ground plane 105, and the second bottom surface planar portion 108A comprises a waveguide antenna element 120.

The planar antenna 100 also comprises a conductor 116, extending through the composite dielectric 103 between the top planar surface 104 and the bottom planar surface 108. This conductor 116 forms a transmission line 116M' and 116S from the planar antenna element 106 to the waveguide antenna element 120.

The planar antenna 100 also comprises a waveguide 124, affixed or mated to the second bottom surface planar portion 108A. The waveguide 124 comprises a conductive cavity disposed about the waveguide antenna element 120. In the illustrated embodiment, the waveguide 124 has an axial centerline 130 aligned to the waveguide antenna element 120 and substantially perpendicular to the RF circuit board 102.

In the illustrated embodiment, the planar antenna element 106 comprises a conductive surface having an aperture 114, and the conductive surface is aperture coupled to the transmission line 116M'. For example, the antenna conductive surface comprises a slot aperture 114, and at least a portion of the transmission line 116 is disposed within the composite dielectric 103 between the slot aperture 114 and the bottom surface conductive ground plane 107.

Also in the illustrated embodiment, the top surface conductive ground plane 105 overlaps the bottom surface conductive ground plane 107 in a direction perpendicular to the bottom surface 108 and the top planar surface 104 at an overlapping portion 126 of the circuit board 102. Also, the bottom surface conductive ground plane 107 is electrically shorted to the top surface conductive ground plane 105 by one or more vias 128 extending through the circuit board 102 at the overlapping portion 126. Overlapping conductors along an edge of the circuit board 102 may also be employed.

Note that in the illustrated embodiment, the conductor 116 comprises a stripline transmission line portion 116S formed with the top surface conductive ground plane 105 and the bottom surface conductive ground plane 107 in the overlapping portion 126. The conductor 116 also comprises a first microstrip transmission line portion 116M formed with the top surface conductive ground plane and a second microstrip transmission line portion 116M' formed with the bottom surface conductive ground plane elsewhere on the circuit board. Note also that a dimension of the stripline transmission line portion 116S of the conductor 116 varies from a dimension of the first microstrip transmission line portion 116M and the second microstrip transmission line portion 116M' to match the impedance of the first microstrip line portion 116M and the second microstrip transmission line portion 116M', respectively.

FIGS. 2A-2E are diagrams showing one embodiment of the different layers of the composite dielectric 103 through slice A-A' of FIG. 1B and how they may be assembled into the RF circuit board 102. In the illustrated embodiment, the top surface conductive ground plane 105 and the planar antenna element(s) 106 are formed by a first conductive material 202C on a top surface of a first layer 202D of the composite dielectric. Since the illustrated cut is of A-A', first conductive material 202C represents the antenna element 106.

Further, the conductor 116 is formed by a second conductive material 206C on a top surface of a third layer 206D of the composite dielectric 103, and the bottom surface conductive ground plane 107 is formed by a third conductive material 208C on a bottom surface of a fourth layer of the composite dielectric 208D. Such conductive materials 202C, 206C and 208C may be formed on the layers of the composite dielectric 202D, 206D, and 208D respectively, by patterning or printing the first conductive material 202C on the top surface of the first layer 202D of the composite dielectric 103, patterning or printing the second conductive material 206C on the top surface of the third layer 206D of the composite dielectric 103, and patterning or printing the third conductive material 208C on the bottom surface of the fourth layer 208D of the composite dielectric 103. Similarly, conductive materials 202C, 206C and 208C may be formed using subtractive (e.g. laser etch) techniques or a successive combination of subtractive and additive (e.g. printing or patterning) methods.

The planar antenna may be thereafter formed by disposing a first adhesive film 202F between the first layer 202D of the composite dielectric 103 and the second layer 204D of the composite dielectric, disposing a second adhesive film 204F between the second layer 204D and the third layer 206D of the composite dielectric 103, disposing a third adhesive film 206F between the third layer 206D and the fourth layer 208D of the composite dielectric 103, aligning the first 202D, second 204D, third 206D, and fourth 208D layers of the composite dielectric 103, and bonding together the first layer 202D of the composite dielectric 103, the second layer 204D of the composite dielectric 103, the third layer 206D, and the fourth layer 208D of the composite dielectric 103 with the first adhesive film 202F, the second adhesive film 204F, and the third adhesive film 206F. One or more vias 128 can be used to electrically short the upper conductive ground plane 105 and the bottom surface conductive ground plane 107. Finally, the waveguide 124 may be affixed to the second bottom surface planar portion 108A encompassing the waveguide antenna element 120, thereby forming a conductive cavity about the waveguide antenna element 120.

Figure 3:
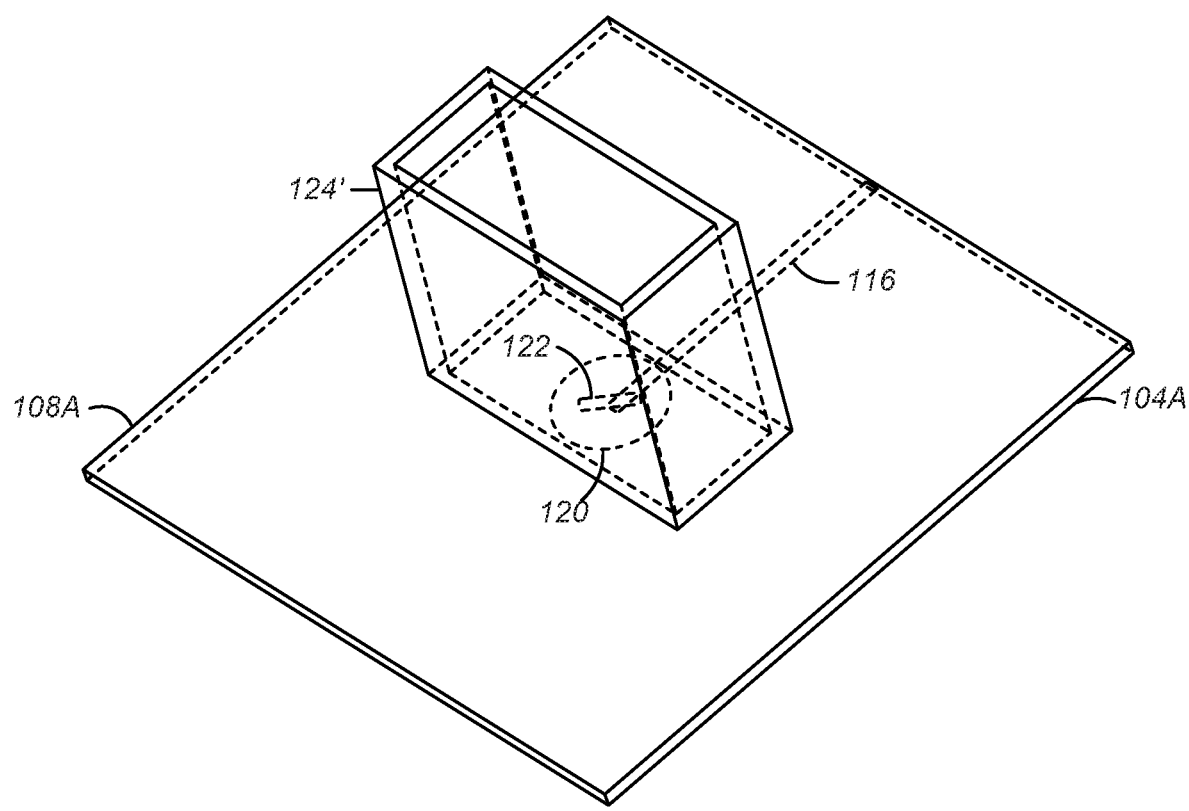
FIG. 3 is a diagram illustrating another embodiment of a portion of the planar antenna.
Figure 4A:
FIGS. 4A-4F are diagrams illustrating one embodiment of the different layers of the composite dielectric 103 through slice B-B' of FIG. 1B and how they may be assembled into an RF circuit board.
Figure 4B:
Figure 4C:
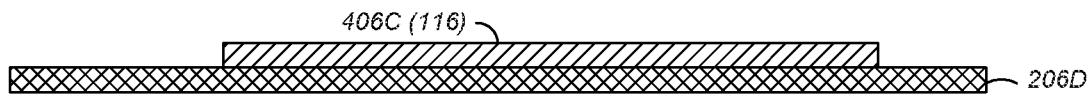
Figure 4D:
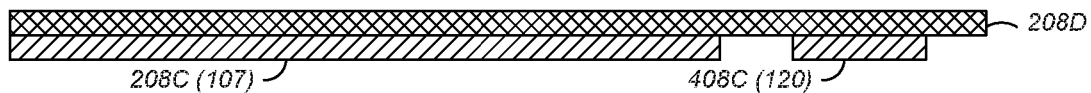
Figure 4E:
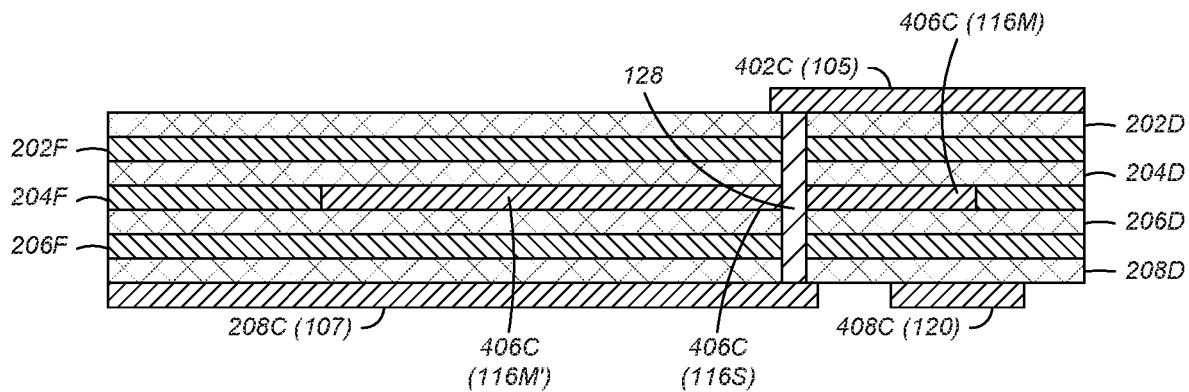
Figure 4F:
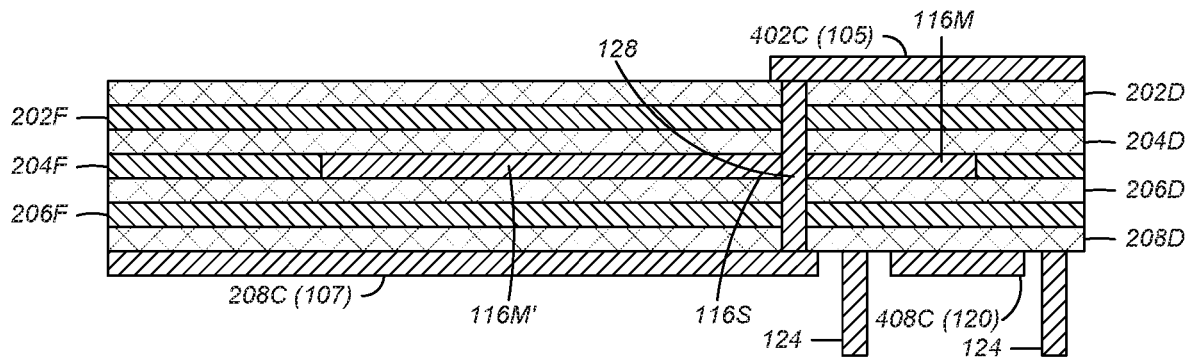

FIG. 3 is a diagram illustrating another embodiment of a portion of the planar antenna 100. In this embodiment, the waveguide 124' is rectangular instead of circular in cross section, and is centered over the waveguide antenna element 120 with the inclusive slot aperture 122.

FIGS. 4A-4F are diagrams illustrating one embodiment of the different layers of the composite dielectric 103 through slice B-B' of FIG. 1B and how they may be assembled into an RF circuit board 102. In the illustrated embodiment, the top surface conductive ground plane 105 is formed by a first conductive material 402C on a top surface of a first layer 202D of the composite dielectric. Since the illustrated cut is of B-B', the antenna element 106 is not illustrated.

Further, the conductor 116 is formed by a second conductive material 406C on a top surface of a third layer 206D of the composite dielectric 103. The bottom surface conductive ground plane 107 is formed by a third conductive material 208C on a bottom surface of a fourth layer of the composite dielectric 208D, and the waveguide antenna element 120 is formed by fourth conductive material 408C on the bottom surface of the fourth layer of the composite dielectric 208D. Such conductive materials 402C, 406C, 208C, and 408C may be formed on the layers of the composite dielectric 202D, 206D, and 208D respectively, by additive methods such as patterning or printing or by using subtractive (e.g. etching) techniques or a successive combination of subtractive and additive methods.

The planar antenna may be thereafter formed by disposing the first adhesive film 202F between the first layer 202D of the composite dielectric 103 and the second layer 204D of the composite dielectric, disposing the second adhesive film 204F between the second layer 204D and the third layer 206D of the composite dielectric 103, disposing the third adhesive film 206F between the third layer 206D and the fourth layer 208D of the composite dielectric 103, aligning the first 202D, second 204D, third 206D, and fourth 208D layers of the composite dielectric 103, and bonding together the first layer 202D, the second layer 204D, the third layer 206D, and the fourth layer 208D of the composite dielectric 103 with the first adhesive film 202F, the second adhesive film 204F, and the third adhesive film 206F. One or more vias 128 can then be used to electrically short the upper conductive ground plane 105 and the bottom surface conductive ground plane 107. Alternatively, other means of shorting the upper conductive ground plane 105 to the bottom surface conductive ground plane 107 may be used. Finally, the waveguide 124 may be affixed to the second bottom surface planar portion 108A encompassing the waveguide antenna element 120, thereby forming a conductive cavity about the waveguide antenna element 120.

The result of the operations described in FIGS. 2A-2E and 4A-4F is a waveguide-fed planar antenna array with a 4×4 array 109 of transmitting/receiving planar antenna patch elements 106 fed by a waveguide 124 on the backside. The waveguide-fed array has a waveguide 124 integrated (or mated) onto an RF circuit board 102 that is aperture coupled to an embedded microstrip 116M using a waveguide antenna element 120 with an inclusive slot aperture 122. The microstrip feed 116M is then transitioned to a stripline feed 116S then back to a microstrip feed 116M'. The microstrip feed 116M' is then power divided by one or more power dividers 118 and aperture coupled fed to antenna elements 106 (i.e., antenna array) with inclusive slot apertures 114. There are four dielectric layers 202D-208D separating the bottom surface conductive ground plane 107 (metal layer 1 208C), microstrip feed 116 (metal layer 2 206C), and antenna array elements (metal layer 3 202C). The antenna elements 106 and waveguide antenna element 120 have diameters and inclusive slot apertures 114, 122 have lengths and widths with dimensions such as to maximize power radiation and transmission at the desired operating frequency.

Figure 5:
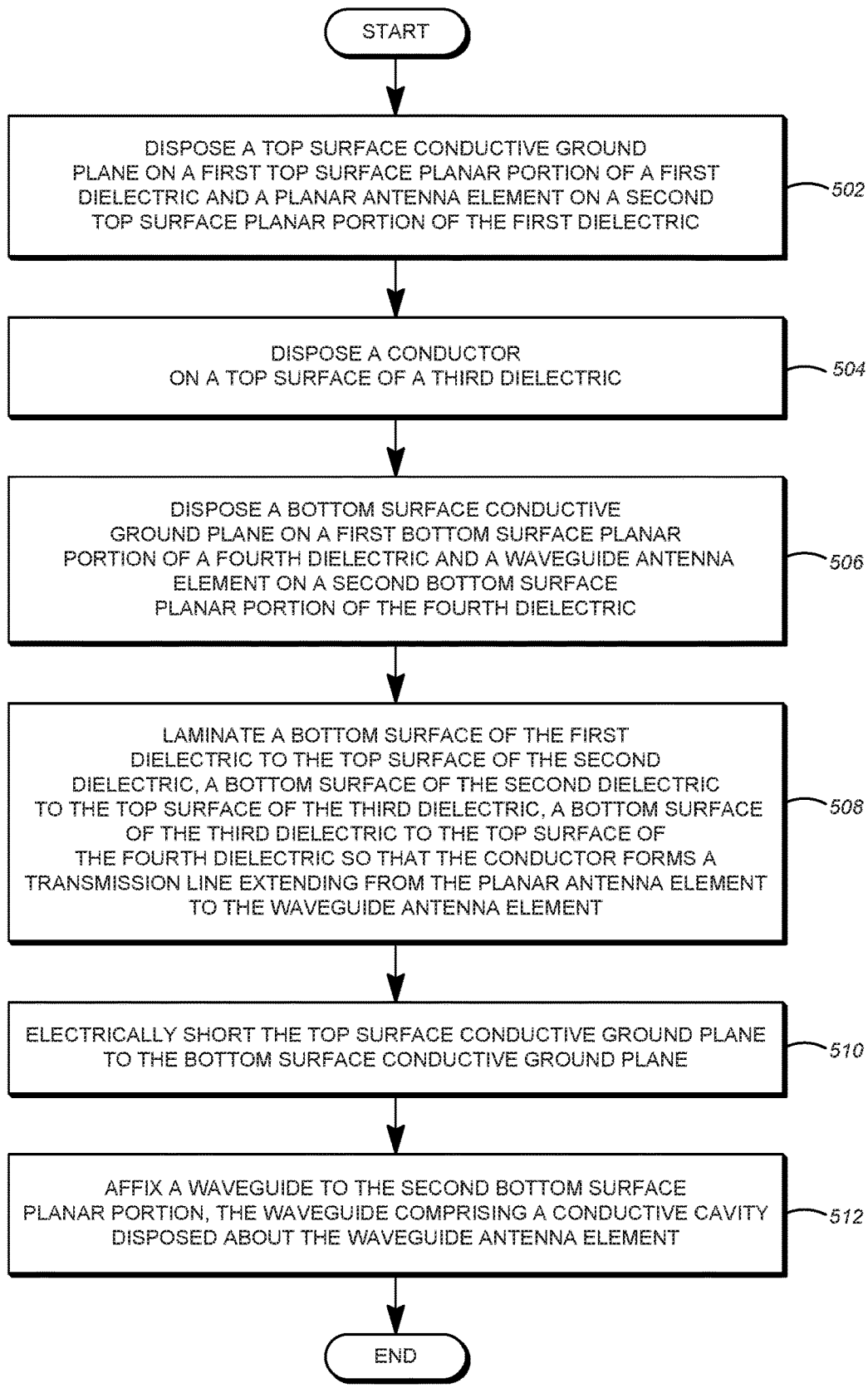
FIG. 5 is a diagram presenting a flow chart of an embodiment of a method for producing the antenna array.

FIG. 5 is a diagram presenting a flow chart of an embodiment of a method for producing the planar antenna 100. In block 502, a top surface conductive ground plane 105 is disposed on a first top surface planar portion 104A of a first layer of the dielectric 202D, and a planar antenna element 106 is disposed on a second top surface planar portion 104B of the first layer 202D of the composite dielectric. In block 504, a conductor 206C forming a transmission line 116 is disposed on a top surface of a third layer 206D of the composite dielectric. In block 506, a bottom surface conductive ground plane 107 is disposed on a fourth layer 208D of the composite dielectric, and a waveguide antenna element 120 is disposed on a second bottom surface planar portion 108A of the fourth dielectric 208D. In block 508, a bottom surface planar portion of the first dielectric 202D is laminated to the top surface of the second layer 204D of the composite dielectric, a bottom surface planar portion of the second dielectric 204D is laminated to the top surface of the third layer 206D of the composite dielectric, and a bottom surface planar portion of the third dielectric 206D is laminated to a top surface of the fourth layer 208D of the composite dielectric so that the conductor 206C forms the transmission line 116 from the planar antenna element 106 to the waveguide antenna element 120. The foregoing laminations may be accomplished using a non-conductive adhesive film between the dielectric layers 202D-208D.

Returning to FIG. 5, in block 510, the top surface conductive ground plane 105 is electrically shorted to the bottom surface electrical ground plane 107, for example using one or more vias 128 extending through the composite dielectric. Finally, in block 512, a waveguide is affixed to the second bottom surface planar portion, wherein the waveguide comprises a conductive cavity disposed about the waveguide antenna element.

Figure 6A:
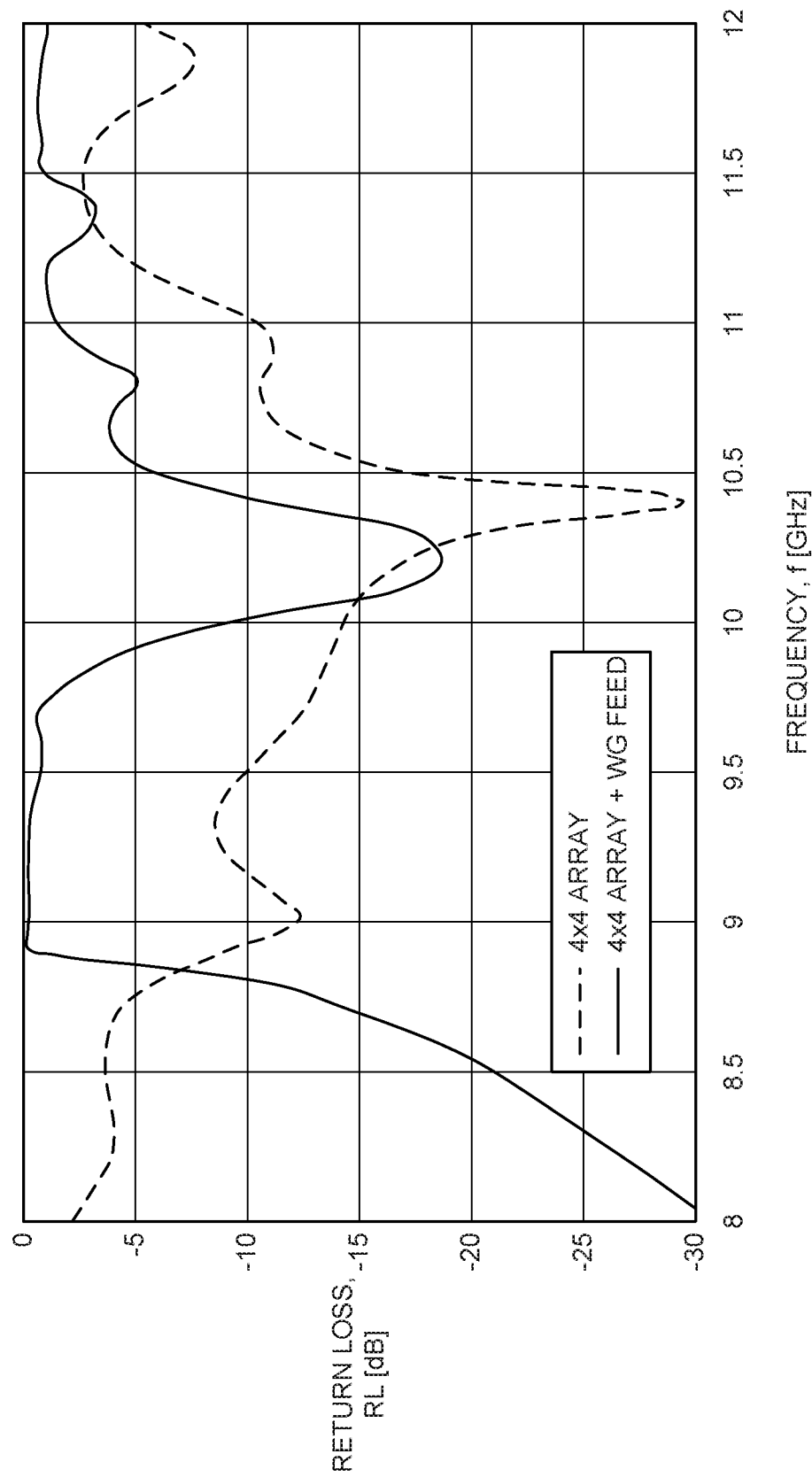
FIGS. 6A and 6B are diagrams illustrating predicted performance of one embodiment of the planar antenna.
Figure 6B:
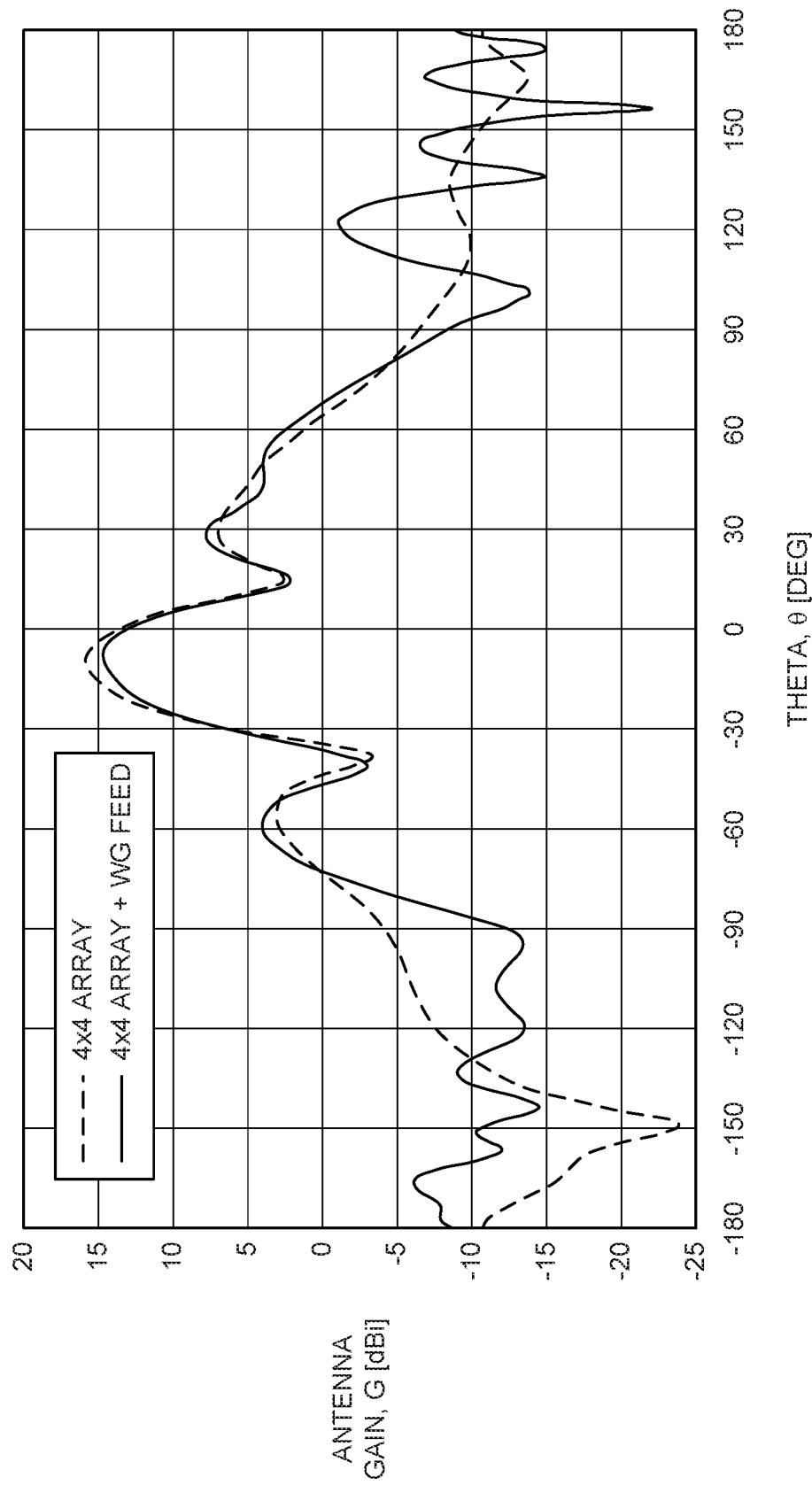

FIGS. 6A and 6B are diagrams illustrating predicted performance of the planar antenna 100. A finite element method (FEM) solver was used to predict the performance of a waveguide-fed planar 4×4 antenna array designed to operate near 10 GHz. FIG. 6A is a diagram of return loss (dB) for a waveguide-fed 4×4 antenna array, and FIG. 6B is a diagram illustrating antenna gain (dBi).

For comparison, a FEM model of the 4×4 antenna array without the waveguide feed is also shown in both figures. The results show a ~1 dB drop in antenna gain due to the addition of the waveguide feed. This is due to the loss of the transition from the antenna array to the waveguide feed. The impedance bandwidth of the waveguide-fed array is decreased to ~350 MHz, which matches the bandwidth of the microstrip to waveguide transition. The surface dimensions of the waveguide-fed antenna array are 129 mm×76 mm and the board has four layers of 10 mil PYRALUX.

While a planar antenna has been described above, the principles of the antenna are not limited to antennas that are perfectly planar. The antenna may be substantially planar or even curved to conform a particular shape as desired. Embodiments such as these can be created with flexible dielectric and conductive materials.

Hardware Environment

Figure 7:
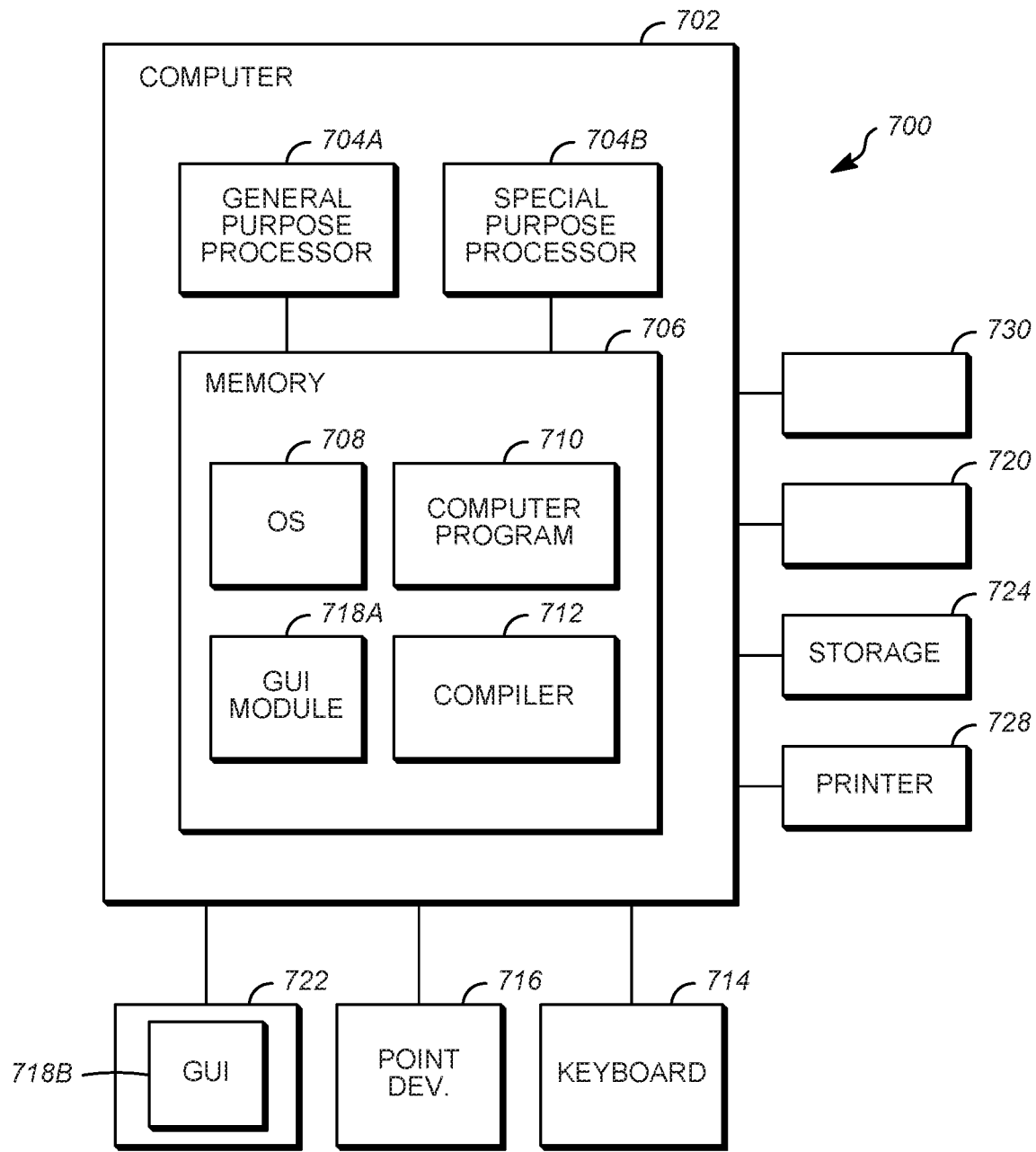
FIG. 7 illustrates an exemplary computer system that could be used to implement processing elements of the above disclosure, including the defining of the conductive structures and etching of the dielectric layers.

FIG. 7 illustrates an exemplary computer system 700 that could be used to implement processing elements of the above disclosure, including the defining of the conductive structures and etching of the dielectric layers. The computer 702 comprises a processor 704 and a memory, such as random access memory (RAM) 706. The computer 702 is operatively coupled to a display 722, which presents images such as windows to the user on a graphical user interface 718B. The computer 702 may be coupled to other devices, such as a keyboard 714, a mouse device 716, a printer, etc. Of course, those skilled in the art will recognize that any combination of the above components, or any number of different components, peripherals, and other devices, may be used with the computer 702, including printer 728.

Generally, the computer 702 operates under control of an operating system 708 stored in the memory 706, and interfaces with the user to accept inputs and commands and to present results through a graphical user interface (GUI) module 718A. Although the GUI module 718B is depicted as a separate module, the instructions performing the GUI functions can be resident or distributed in the operating system 708, the computer program 710, or implemented with special purpose memory and processors. The computer 702 also implements a compiler 712 which allows an application program 710 written in a programming language such as COBOL, C++, FORTRAN, or other language to be translated into processor 704 readable code. After completion, the application 710 accesses and manipulates data stored in the memory 706 of the computer 702 using the relationships and logic that was generated using the compiler 712. The computer 702 also optionally comprises an external communication device such as a modem, satellite link, Ethernet card, or other device for communicating with other computers.

In one embodiment, instructions implementing the operating system 708, the computer program 710, and the compiler 712 are tangibly embodied in a computer-readable medium, e.g., data storage device 720, which could include one or more fixed or removable data storage devices, such as a zip drive, floppy disc drive 724, hard drive, CD-ROM drive, tape drive, etc. Further, the operating system 708 and the computer program 710 are comprised of instructions which, when read and executed by the computer 702, causes the computer 702 to perform the operations herein described. Computer program 710 and/or operating instructions may also be tangibly embodied in memory 706 and/or data communications devices 730, thereby making a computer program product or article of manufacture. As such, the terms "article of manufacture," "program storage device" and "computer program product" as used herein are intended to encompass a computer program accessible from any computer readable device or media.

Those skilled in the art will recognize many modifications may be made to this configuration without departing from the scope of the present disclosure. For example, those skilled in the art will recognize that any combination of the above components, or any number of different components, peripherals, and other devices, may be used.

CONCLUSION

This concludes the description of the preferred embodiments of the present disclosure.

The foregoing description of the preferred embodiment has been presented for the purposes of illustration and description. It is not intended to be exhaustive or to limit the disclosure to the precise form disclosed. Many modifications and variations are possible in light of the above teaching. It is intended that the scope of rights be limited not by this detailed description, but rather by the claims appended hereto.

What is claimed is:

1. A planar antenna, comprising
  a circuit board comprising:
    a composite dielectric having:
      a top planar surface, having:
        a first top surface planar portion having a top surface conductive ground plane on the top planar surface of the composite dielectric;
        a second top surface planar portion, coplanar with the first top surface planar portion, the second top surface planar portion having at least one planar antenna element on the top planar surface of the composite dielectric;
a bottom planar surface, having:
a first bottom surface planar portion having a bottom surface conductive ground plane on the bottom planar surface of the composite dielectric, the bottom surface conductive ground plane electrically shorted to the top surface conductive ground plane and disposed below the at least one planar antenna element;
a second bottom surface planar portion, coplanar with the first bottom surface planar portion, the second bottom surface planar portion having a waveguide antenna element;
a conductor, extending through the composite dielectric between the top planar surface and the bottom planar surface, the conductor forming a transmission line extending from the planar antenna element to the waveguide antenna element; and
a waveguide, affixed to the second bottom surface planar portion, the waveguide comprising a conductive cavity disposed about the waveguide antenna element.

2. The planar antenna of claim 1, wherein:
the planar antenna element comprises an antenna conductive surface having an aperture; and
the conductive surface is aperture coupled to the transmission line.

3. The planar antenna of claim 2, wherein:
the aperture is a slot aperture; and
at least a portion of the transmission line is disposed within the composite dielectric between the slot aperture and the bottom surface conductive ground plane.

4. The planar antenna of claim 3, wherein:
the top surface conductive ground plane overlaps the bottom surface conductive ground plane in a direction perpendicular to the bottom planar surface and the top planar surface at an overlapping portion of the circuit board; and
bottom surface conductive ground plane is electrically shorted to the top surface conductive ground plane by at least one via extending through the circuit board at the overlapping portion.

5. The planar antenna of claim 4, wherein the conductor comprises:
a stripline transmission line portion formed with the top surface conductive ground plane and the bottom surface conductive ground plane in the overlapping portion of the top surface conductive ground plane and the bottom surface conductive ground plane;
a first microstrip transmission line portion formed with the top surface conductive ground plane; and
a second microstrip transmission line portion formed with the bottom surface conductive ground plane elsewhere on the circuit board.

6. The planar antenna of claim 5, wherein a dimension of the stripline transmission line portion of the conductor varies from a dimension of the first microstrip transmission line portion to match an impedance of the first microstrip line portion.

7. The planar antenna of claim 3, wherein:
the second top surface planar portion comprises an array of a plurality of transmitting antenna elements, each comprising an associated slot aperture; and
at least a portion of the transmission line is disposed within the composite dielectric between each of the array of the plurality of transmitting antenna elements and the bottom surface conductive ground plane.

8. The planar antenna of claim 7, wherein the conductor further forms one or more power dividers disposed between the at least a portion of the transmission line disposed under each of the array of the plurality of transmitting antenna elements.

9. The planar antenna of claim 7, wherein the array is a 4×4 array.

10. The planar antenna of claim 1, wherein:
the top surface conductive ground plane and the planar antenna element are formed by a first conductive material on a top surface of a first layer of the composite dielectric;
the conductor is formed by a second conductive material on a top surface of a second layer of the composite dielectric; and
the bottom surface conductive ground plane is formed by a third conductive material on a bottom surface of a third layer of the composite dielectric.

11. The planar antenna of claim 10, wherein
the first conductive material is patterned on the top surface of the first layer of the composite dielectric;
the second conductive material is patterned on the top surface of the second layer of the composite dielectric; and
the third conductive material is patterned on the bottom surface of the third layer of the composite dielectric.

12. The planar antenna of claim 10, wherein
the first conductive material is printed on the top surface of the first layer of the composite dielectric;
the second conductive material is printed on the top surface of the second layer of the composite dielectric; and
the third conductive material is printed on the bottom surface of the third layer of the composite dielectric.

13. The planar antenna of claim 10, wherein:
the planar antenna is formed by:
disposing a first adhesive film between the first layer of the composite dielectric and a fourth layer of the composite dielectric;
disposing a second adhesive film between the fourth layer and the second layer of the composite dielectric;
disposing a third adhesive film between the second layer and the second layer of the composite dielectric;
aligning the first, second, third, and fourth layers of the composite dielectric; and
bonding together the first layer of the composite dielectric, the second layer of the composite dielectric, the third layer of the composite dielectric, and the fourth layer of the composite dielectric with the first adhesive film, second adhesive film, and the third adhesive film.

14. The planar antenna of claim 10, wherein the planar antenna is further formed by:
mating a waveguide having an axial centerline to the second bottom surface planar portion with the axial centerline aligned to the waveguide antenna element.

15. The planar antenna of claim 10, further comprising:
a first adhesive film between the first layer of the composite dielectric and a fourth layer of the composite dielectric;
a second adhesive film between the fourth layer and the second layer of the composite dielectric; and a third adhesive film between the second layer and the second layer of the composite dielectric.

16. The planar antenna of claim 15, wherein:
the first layer of the composite dielectric, the second layer of the composite dielectric, the third layer of the composite dielectric, and the fourth layer of the composite dielectric are bonded together with the first adhesive film, second adhesive film, and the third adhesive film.

17. The planar antenna of claim 10, wherein the first layer of the composite dielectric, the second layer of the composite dielectric, and the third layer of the composite dielectric are 3D printed.

18. The planar antenna of claim 1, wherein the waveguide is circular in cross section.

19. The planar antenna of claim 1, wherein the waveguide is rectangular in cross section.

20. The planar antenna of claim 1, wherein the waveguide antenna element comprises a slot.

* * * * *